United States Patent [19]

Vermeers

[11] 4,166,974
[45] Sep. 4, 1979

[54] APPARATUS AND METHOD FOR MEASURING CAPACITIVE ENERGY

[75] Inventor: Stanley L. Vermeers, La Jolla, Calif.

[73] Assignee: The United States of America as represented by the Secretary of the Navy, Washington, D.C.

[21] Appl. No.: 871,733

[22] Filed: Jan. 23, 1978

[51] Int. Cl.$^2$ ............................................. G01R 27/26
[52] U.S. Cl. ................................................. 324/60 CD
[58] Field of Search ............. 324/60 R, 60 C, 60 CD, 324/61 R

[56] References Cited

U.S. PATENT DOCUMENTS

| | | | |
|---|---|---|---|
| 3,165,694 | 1/1965 | Young | 324/60 CD |
| 3,193,803 | 7/1965 | Hoffman | 324/60 CD |
| 3,320,527 | 5/1967 | Marlow | 324/60 C |
| 3,886,447 | 5/1975 | Tanaka | 324/60 CD |
| 3,931,610 | 1/1976 | Marin et al. | 324/60 CD X |
| 4,001,813 | 1/1977 | Kosakowski | 324/60 C X |

Primary Examiner—Stanley T. Krawczewicz
Attorney, Agent, or Firm—Richard S. Sciascia; Ervin F. Johnston; James O. Skarsten

[57] ABSTRACT

A system for determining whether or not an amount of energy in excess of a specified minimum amount of energy is stored in a capacitor of unknown capacitance includes a capacitive reference device for storing an amount of energy which is known to be no less than the specified minimum. The system further includes a capacitive calibration device selectively coupled to the capacitive reference device and to the unknown capacitor for providing a first voltage when coupled to the capacitive reference device, and for providing a second voltage when coupled to the unknown capacitor. A comparator device which is calibrated by the first voltage receives the second voltage and provides an indication signal when the unknown capacitor has stored an amount of energy which exceeds the reference amount of energy.

15 Claims, 5 Drawing Figures

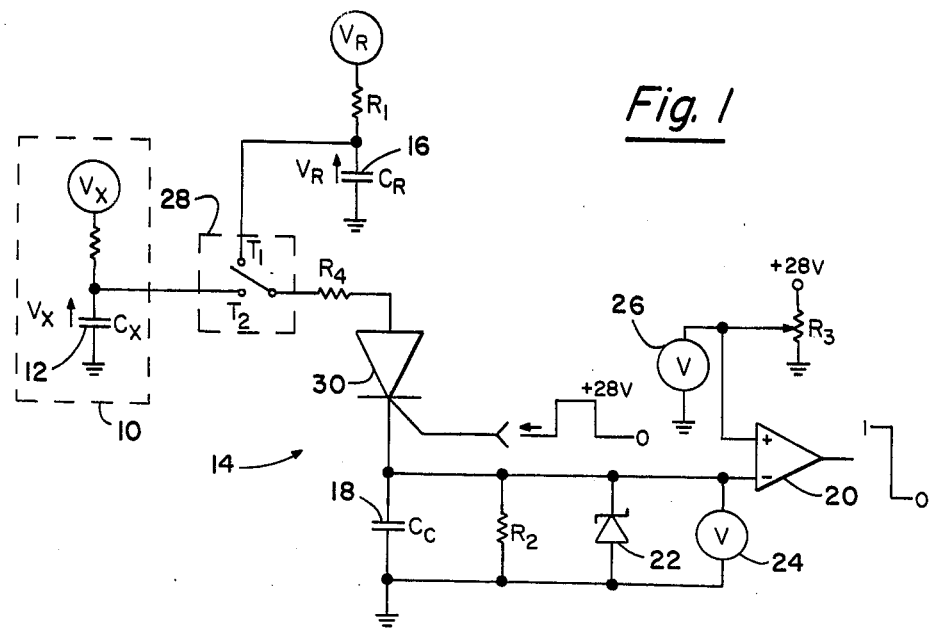
Fig. 1
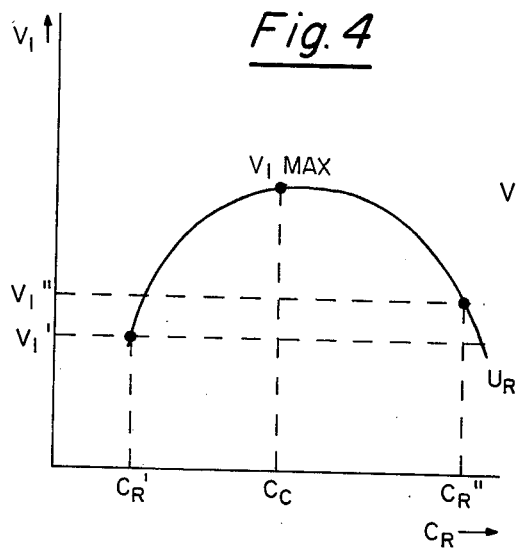
Fig. 4
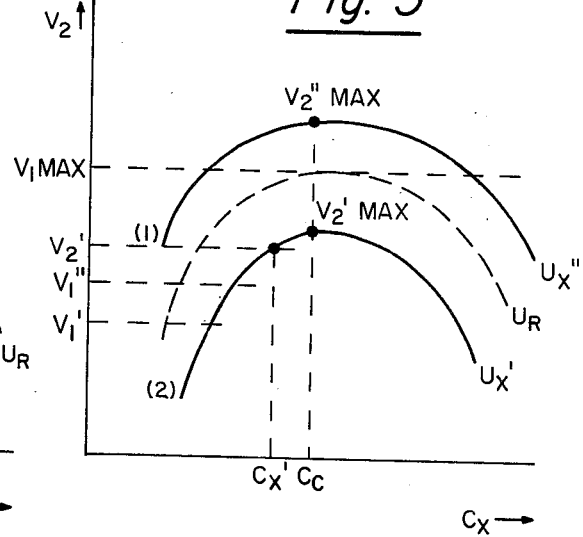
Fig. 5
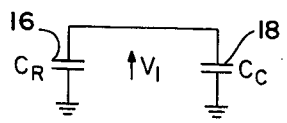
Fig. 2
Fig. 3

APPARATUS AND METHOD FOR MEASURING CAPACITIVE ENERGY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention disclosed and claimed herein pertains generally to a means and method for determining an unknown amount of potential energy which is stored in a capacitor or capacitive electrical network in the form of electric charge. More particularly, the invention pertains to the measurement of the energy which may be stored in a capacitor of unknown capacitance, wherein the voltage across the unknown capacitor is also unknown and may not be easily determined. Even more particularly, the invention pertains to a means and method for determining whether or not a specified minimum amount of energy is stored in a capacitor of unknown capacitance.

In various electrical and electromechanical systems, a specified minimum amount of energy must be stored in a capacitor in order to effectively perform a task required for system operation. In a certain type of rocket, for example, a capacitor storing a specified minimum amount of energy is required for a mechanism employed in the rocket for rapidly releasing the first stage of the rocket from the remainder at a given point during rocket flight. At the given point, the energy stored in the capacitor is used to detonate explosive charges, which are positioned to blow away connecting bolts and provide the required rapid release.

As is well known the potential, or capacitive, energy U which is stored in a capacitor is given by the expression $U=\frac{1}{2}CV^2$, where C is the capacitance of the capacitor and V is the voltage thereacross. However, due to imperfections in real world capacitors, the energy stored in a capacitor coupled to a voltage source may be significantly less than the nominal values of the capacitor and voltage source would indicate. For example, if the capacitor had an unknown internal resistance, the energy actually provided thereby would be below the anticipated amount due to loss across the internal resistance. If the internal resistance was substantial, the capacitor could be unable to deliver a required minimum amount of energy to a system dependent thereupon. Other unknown or unexpected effects which reduce the storage capability of a capacitor include voltage leak, a decrease in capacitance, and total failure of the capacitor.

Consequently, it becomes necessary to measure the energy stored by an energy storage capacitor to determine whether or not sufficient energy can actually be provided thereby for effective system operation.

While various techniques are presently available for determining capacitance, some of such techniques may not be well suited for measuring the capacitance of energy storage capacitors contained within the interior of an elaborate electrical or electromechanical system. Some of such present techniques may also be ineffective where the voltage across the capacitor is unknown and may not be readily measured. In any case, a measuring system requiring the measurement of both the capacitance of and voltage across an energy storage capacitor would be needlessly complicated, since the important determination is whether or not the capacitor is able to store a specified minimum amount of energy.

One presently available technique for measuring the energy stored in a capacitor requires the use of an oscilloscope. An energy storage capacitor is discharged through a fixed resistor, and a curve showing discharge voltage is displayed on the oscilloscope. However, the required oscilloscope is comparatively expensive, and may be too immobile to be used for testing energy storage capacitors which are located within an electrical or electromechanical system rather than in a laboratory. In addition, human calculations are generally necessary as part of such technique, in order to determine stored energy from the displayed data, whereby an operator having a degree of observational and mathematical skill is required, and the possibility of human error is introduced.

Another presently available technique requires the use of an ergmeter, an energy storage capacitor being discharged through the heating element of the ergmeter. However, the ergmeter is sensitive to ambient temperature, and employs a thermistor which requires frequent calibration.

In techniques employing either an oscilloscope or an ergmeter, further errors may occur as a result of line loss or contact resistance.

SUMMARY OF THE INVENTION

The present invention discloses apparatus for testing an unknown amount of capacitive energy stored in an electrical network, the apparatus including a capacitive reference means for storing a selected known amount of energy in order to calibrate the apparatus. The apparatus further includes a capacitive calibration means for receiving a first amount of electric charge from the capacitive reference means during a first time interval, and for receiving a second amount of electric charge from the electrical network during a second time interval. A comparator means is coupled to the capacitive calibration means for comparing a first parameter determined by the first amount of electric charge with a second parameter determined by the second amount of electric charge in order to provide notice when the unknown amount of energy exceeds a preselected threshold value.

In a useful embodiment of the invention a switch means is provided for coupling electric charge from the capacitive reference means to the capacitive calibration means during the first time interval, and for coupling electric charge from the electrical network to the capacitive calibration means during the second time interval, the second time interval being subsequent to the first time interval. Also in the useful embodiment, the capacitive reference means includes a reference capacitor for storing the known amount of energy, and the capacitive calibration means includes a calibration capacitor having a capacitance equal to the capacitance of the reference capacitor.

Alternatively, if the unknown amount of capacitive energy is stored in a capacitor of unknown capacitance, which exceeds a known value of capacitance, the capacitive reference means usefully includes a reference capacitor having a capacitance which is no greater than the known value, and the capacitive calibration means includes a calibration capacitor having a capacitance which is no greater than the capacitance of the reference capacitor.

If the apparatus is to be used as part of a digital system, it is advantageous to use a comparator for the aforementioned comparator means, which has an input coupled to the calibration capacitor and another input coupled to a source of variable voltage. Since a comparator may have only one of two possible output voltages, it is a digital device and may be readily interfaced with a digital system, transistion from one output voltage to the other indicating the storage by an unknown capacitor of energy in excess of the preselected minimum.

The present invention may also be embodied in the form of a method for determining whether or not a specified minimum amount of energy is stored in a capacitor of unknown capacitance, wherein the voltage across the unknown capacitor is also unknown. As a method, the invention comprises the steps of initially storing the reference amount of electric charge in a capacitive reference means; discharging a portion of the reference charge into a calibration capacitor to provide a calibration voltage; calibrating a comparator means according to the calibration voltage; and coupling the unknown capacitor to the calibration capacitor to generate an indicating signal from the comparator when the unknown capacitor has stored an amount of energy which exceeds the specified minimum.

It will be noted that each of the above embodiments may be employed to determine whether or not a specified minimum amount of energy is stored in an unknown capacitor without the need for any human calculation.

It will also be noted that the invention discloses coupling electric charge to a calibration capacitor from both a reference capacitor and an unknown capacitor. By providing a calibration capacitor, charge from both sources passes through the same circuit components, whereby respective errors therein, due to aging, ambient temperature or the like, and respective energy losses thereacross, are cancelled out or nullified.

OBJECTS OF THE INVENTION

An object of the present invention is to provide an improved and greatly simplified system for determining whether or not a specified minimum amount of energy is stored in a capacitor or in an electrical network having an effective capacitance.

Another object is to provide an improved system for testing an unknown amount of energy stored in a capacitor or capacitive network which minimizes the need for precision components, and minimizes or eliminates the effect on respective components of aging and ambient conditions.

Another object of the invention is to provide an improved system for determining whether or not a specified minimum amount of energy is stored in a capacitor of unknown capacitance wherein the voltage across the unknown capacitor is unknown and wherein the need for human observation and adjustment is minimized and the need for human calculation is eliminated.

Another object is to provide an improved system for determining whether or not a specified minimum amount of energy is stored in a capacitor of unknown capacitance wherein the system provides a digital output.

Another object of the invention is to provide an improved system for determining whether or not a specified minimum amount of energy is stored in a capacitor of unknown capacitance, wherein the voltage across the unknown capacitor is unknown, wherein a capacitive calibration means is employed to nullify the effects of errors in the nominal values of respective system components.

These and other objects of the invention will become more readily apparent from the ensuing specification when taken together with the drawings.

BRIEF DESCRIPTION OF THE DRAWINGS

FIG. 1 is a schematic drawing showing an embodiment of the invention.

FIG. 2 is a schematic drawing showing a voltage across interconnected reference and calibration capacitors in the embodiment of FIG. 1.

FIG. 3 is a schematic drawing showing a voltage across interconnected unknown and calibration capacitors in the embodiment of FIG. 1.

FIGS. 4–5 are graphs showing mathematical curves which are useful for understanding the embodiment of FIG. 1.

DESCRIPTION OF THE PREFERRED EMBODIMENT

Referring to FIG. 1, there is shown an electrical or electromechanical system 10 which includes a capacitor 12 having a capacitance $C_x$ and a voltage $V_x$ thereacross, both $C_X$ and $V_X$ being unknown. Unknown capacitor 12 comprises a discrete capacitor, a set of interconnected capacitors or an electrical network having an effective capacitance, and must store an amount of energy equal to or in excess of a specified minimum in order to enable effective operation of system 10.

To determine whether or not unknown capacitor 12, coupled to unknown voltage $V_X$ is able to store the minimum amount of energy, apparatus 14 is coupled thereto. Apparatus 14 includes a reference capacitor 16 having a capacitance $C_R$ which is known to within a selected degree of accuracy, capacitor 16 initially storing an amount of energy $U_R$ which is known to be equal to the minimum amount of energy required by system 10. A voltage source $V_R$ is coupled to reference capacitor 16 through resistor $R_1$ so that $U_R = \frac{1}{2}C_R V_R^2$, according to a well known relationship.

FIG. 1 also shows apparatus 14 including a calibration capacitor 18 which has a capacitance $C_C$ equal to $C_R$, and which is coupled to the negative input of a comparator 20, a resistor $R_2$, a Zener diode 22, and a volt meter 24 all being coupled in parallel with calibration capacitor 18. A variable voltage is coupled to the positive input of comparator 20 in parallel with a second volt meter 26, by means of a 28 V. voltage source and a variable resistor $R_3$.

To determine whether or not the energy stored in capacitor 12 exceeds the required minimum amount, a mechanical relay switch 28 is moved to a position $T_1$, and then an energizing pulse is coupled to electronic switch 30 at the beginning of a first time interval, pulse width being equal to the duration of the first time interval. Thereupon, reference capacitor 16 discharges into calibration capacitor 18 for the duration of the first time interval, which is equal to five time constants or five times the product of $C_c$ and the resistance of resistor $R_2$. The voltage across capacitors 16 and 18 at the conclusion of the first time interval comprises a calibration voltage $V_1$, where $V_1 = [C_R/(C_R + C_C)]V_R$ according to a well known relationship.

Apparatus 14 requires mechanical relay switch 28 to conduct the initially high current resulting from the discharge of capacitor 16, and resistor $R_4$ is connected between switches 28 and 30 as a current limiting resistor. Electronic switch 30 is provided to ensure that the contacts of mechanical switch 28 are closed before capacitor 16 discharges, in order to prevent the contacts of mechanical switch 28 from bouncing during current flow. Resistor $R_2$ is provided to discharge calibration capacitor 18 at the conclusion of the first time interval, and has a resistance equal to the resistance of resistor $R_1$ to cancel the charging effect of $R_1$. The product of capacitance $C_c$ and the resistance of $R_2$ is made to be 100 times the product of $C_R$, $C_c$, and the resistance of $R_4$ to make the effects of $R_1$ and $R_2$ negligible. Zener diode 22 is provided to protect the input to analog comparator 20 in the event of a circuit or component failure.

After the first time interval, analog comparator 20 is calibrated by observing the voltage $V_1$ by means of voltmeter 24, and by adjusting resistor $R_3$ until the voltage applied to the positive terminal of comparator 20 is equal to calibration voltage $V_1$, as shown by voltmeter 26.

When comparator 20 has been calibrated, the amount of energy contained by unknown capacitor 12 is tested by positioning switch 28 at terminal $T_2$, and then energizing electronic switch 30 for a second time interval having a duration equal to the first time interval. During the second time interval unknown capacitor 12 discharges into calibration capacitor 18 to generate a voltage $V_2$ thereacross where $V_2 = [C_x/(C_x + C_c)]V_x$.

If $V_2$, applied to the negative terminal of comparator 20, exceeds calibration voltage $V_1$, applied to the positive terminal thereof, comparator 20 will transit from a logic 1 state to a logic 0 state, as is well known. It will be shown hereinafter that if $C_R = C_c$, $V_2$ will exceed $V_1$ only if $U_x$, the energy stored in unknown capacitor 12, exceeds $U_R$ which, as aforestated, is the minimum energy required for the operation of system 10. Consequently, a 1 to 0 transition of the comparator 20 output comprises a signal indicating that $U_x$ exceeds $U_R$.

At the conclusion of the second time interval capacitor 12 will recharge to once again store energy $U_x$.

It will be readily apparent that by discharging both reference capacitor 16 and unknown capacitor 12 into calibration capacitor 18, errors due to energy loss from line and contact resistance and from voltage drop across electronic switch 30 are mutual and therefore cancelled out.

If system 10 comprises the first stage release mechanism of the aforementioned rocket system, $R_1$ and $R_2$ are usefully selected to be 470 ohms, $R_4$ to be one ohm, and $C_R$ and $C_c$ to be 1500 microfarad capacitors. Comparator 20 may comprise a National LH2111D comparator, Zener diode 22 a 1N3022 Zener diode, and electronic switch 30, a 2N685 Silicon Controlled Rectifier. However, it is by no means intended to limit any of the aforementioned components respectively thereto, nor to limit the invention to such application.

Referring to FIG. 2, calibration voltage $V_1$ is shown across interconnected capacitors 16 and 18 at the conclusion of a first time interval, where reference capacitor 16, just prior to the first time interval, stores a known amount of energy $U_R$ and has a voltage $V_R$ thereacross, as previously stated. Also as previously stated, $V_1 = [C_R/(C_R+C_c)]V_R$ and $U_R = \frac{1}{2}C_R V_R^2$, whereby $V_1 = \sqrt{2U_R}\sqrt{C_R}/(C_R+C_c)$.

Similarly, FIG. 3 shows voltage $V_2$ across capacitors 12 and 18 at the conclusion of a second time interval, where $V_2 = \sqrt{2U_x}\sqrt{C_x}/(C_x+C_c)$, $U_x$ being an unknown amount of energy stored in capacitor 12, as aforementioned.

Referring to FIG. 4, there is shown a plot of $V_1$ versus $C_R$ for an arbitrary value of $C_c$, and referring to FIG. 5, there are shown curves (1) and (2). Curve (1) comprises a plot of $V_2$ versus $C_X$ for the same value of $C_c$ and for an unknown amount of energy $U_x'$ initially stored in unknown capacitor 18, where $U_x'$ is less than $U_R$. Similarly, curve (2) comprises a plot of $V_2$ versus $C_x$ for an amount of energy $U_x''$ initially stored in unknown capacitor 18, where $U_x''$ is greater than $U_R$. Voltage $V_1$ and capacitance $C_R$ of FIG. 4 are plotted on the same respective scales as voltage $V_2$ and capacitance $C_x$ of FIG. 5.

The curve of FIG. 4 shows, and it may be demonstrated mathematically, that for a given value of $U_R$ the voltage $V_1$ is maximized by making $C_R$ equal to $C_c$. Similarly, both curves (1) and (2) of FIG. 5 show maximum values of $V_2$ occurring for $C_x$ equal to $C_c$. Consequently, by making the capacitances of reference capacitor 16 and calibration capacitor 18 equal, comparator 20 will always be calibrated by a voltage $V_1$ which is the maximum possible voltage which can be provided by a given amount of energy $U_R$. It follows therefrom that the only condition under which a voltage $V_2$ will exceed calibration voltage $V_1$ is the condition that the energy stored in capacitor 12 exceeds the reference amount of energy, $U_R$.

The curve of FIG. 4 and curve (2) of FIG. 5 together show that if the value of $C_R$ is $C_R' < C_c$, the resulting calibration voltage $V_1'$ is less than voltage $V_2'$, even though $U_x'$, the energy stored in a capacitor 12 having capacitance $C_x'$, is less than the required minimum. Such an error is most likely to occur where $C_R'$ is much less than $C_c$, and $C_x$ is very close in value to $C_c$. Similarly, if the value of $C_R$ is $C_R'' < C_c$, the resulting calibration voltage $V_1''$ is also less than $V_2'$.

FIGS. 4-5 suggest a modification to the above embodiment, which may be very useful when the lowest possible value that $C_x$ may be is known. According to the modification, $C_R$ is made to be no greater than the lowest possible value of $C_x$, and $C_c$ is made to be no greater than $C_R$. Given such relationship between $C_x$, $C_R$, and $C_C$, an amount of energy $U_x$ will provide a voltage exceeding the calibration voltage only when $U_x$ exceeds the reference energy. By employing the modification, the importance of error in the reference and calibration capacitors is substantially lessened, since it is only necessary that $C_x > C_R > C_c$.

In other modifications, other means or techniques which will readily occur to those skilled in the art may be substituted for voltmeters 24 and 26 to calibrate comparator 20, including means or techniques which eliminate the need for human observation or adjustment.

Obviously, many other modifications and variations of the present invention are possible in the light of the above teachings, and, it is therefore understood that within the scope of the disclosed inventive concept, the invention may be practiced otherwise than specifically described.

What is claimed is:

1. Apparatus for determining whether or not an amount of energy in excess of a specified minimum amount of energy is stored in a capacitor of unknown capacitance, said apparatus comprising:

capacitive reference means having a selected capacitance for storing a reference amount of energy which is known to be no less than said specified minimum;

capacitive calibration means having a capacitance which is equal to the capacitance of said reference means, and which is selectively coupled to said capacitive reference means and to said unknown capacitor, for providing a first voltage when said capacitive calibration means is coupled to said capacitive reference means, and for providing a second voltage when said capacitive calibration means is coupled to said unknown voltage; and a comparator means calibrated by said first voltage for providing an indication signal when said unknown capacitor has stored an amount of energy exceeding said reference amount of energy.

2. The apparatus of claim 1 wherein:
said apparatus includes a switch means for coupling electric charge from said capacitive reference means to said capacitive calibration means during a first time interval, and for coupling electric charge from said unknown capacitor to said capacitive calibration means during a second time interval, which is subsequent to said first time interval.

3. The apparatus of claim 1 wherein:
said capacitive reference means includes a reference capacitor for storing said known amount of energy and;
said capacitive calibration means includes a calibration capacitor having a capacitance equal to the capacitance of said reference capacitor.

4. The apparatus of claim 1 wherein:
the capacitance of said unknown capacitor exceeds a known value of capacitance;
said capacitive reference means includes a reference capacitor having a capacitance which is no greater than said known value of capacitance and;
said capacitive calibration means includes a calibration capacitor having a capacitance which is no greater than the capacitance of said reference capacitor.

5. The apparatus of claim 3 wherein:
said means for providing an indication signal comprises a comparator having an input coupled to said calibration capacitor and another input coupled to a source of variable voltage, said comparator having a digital output comprising a first and a second state, and said indication signal comprising the transistion of said comparator output from said first state to said second state.

6. The apparatus of claim 5 wherein:
said apparatus includes a mechanical switch and an electronic switch connected in series for coupling electric charge from said reference capacitor to said calibration capacitor during a first time interval, and for coupling electric charge from said unknown capacitor to said calibration capacitor during a second time interval, which is subsequent to said first time interval.

7. The apparatus of claim 6 wherein:
said first time interval and said second time interval are both equal to five times the product of the capacitance of said calibration capacitor and the resistance of a resistor connected in parallel with said calibration capacitor.

8. A method for determining whether or not a specified minimum amount of energy is stored in a capacitor of unknown capacitance, wherein the voltage across the unknown capacitor is unknown, the method comprising the steps of:

initially storing a reference amount of electric charge in a capacitive reference means;

discharging a portion of said reference charge into a calibration capacitor to provide a calibration voltage;

calibrating a comparator means according to said calibration voltage;

coupling said unknown capacitor to said calibration capacitor to generate an indication signal from said comparator means when said unknown capacitor has stored an amount of energy which exceeds said specified minimum.

9. The method of claim 8 wherein:
said reference charge is initially stored in a reference capacitor having a capacitance equal to the capacitance of said calibration capacitor.

10. The method of claim 8 wherein the capacitance of said unknown capacitor exceeds a known value and:
said reference charge is initially stored in a reference capacitor having a capacitance which does not exceed said known
value, and said calibration capacitor has a capacitance which does not exceed the capacitance of said reference capacitor.

11. The method of claim 9 wherein:
an amount of energy equal to said specified minimum amount of energy is initially stored in said reference capacitor by coupling a source of known voltage to said reference capacitor.

12. The method of claim 8 wherein:
said discharging step includes discharging a portion of said reference charge into said calibration capacitor during a first time interval; and
said coupling step includes coupling said unknown capacitor to said calibration capacitor during a second time interval which is subsequent to said first time interval, said first and second time intervals being equal.

13. The method of claim 12 wherein:
said calibrating step includes coupling a voltage equal to said calibration voltage to a first input of said comparator means between said first and said second time intervals, said calibration voltage being coupled to a second input of said comparator means.

14. Apparatus for testing an unknown amount of capacitive energy stored in a capacitance of an electrical network, said capacitance of said network being unknown, said apparatus comprising:

reference means having a selected capacitance for storing a selected known amount of energy;

calibration means having a selected capacitance for storing electric charge received by said calibration means during each of a plurality of time intervals;

switching means for coupling electric charge from the capacitance of said reference means to the capacitance of said calibration means for the duration of a first time interval, and for coupling electric charge from the capacitance of said network to the capacitance of said calibration means for the duration of a second time interval, said first and second time intervals having a pre-selected relationship; and means coupled to said calibration means for comparing a first parameter, determined by the amount of electric charge which is coupled to said calibration means during said first time interval, with a second parameter, determined by the amount of electric charge which is coupled to said calibration means during said second time interval, in order to provide notice when said unknown amount of energy exceeds said selected known amount of energy.

15. The apparatus of claim 14 wherein:
said switching means comprises means for coupling electric charge from said reference means to said calibration means for the duration of a first time interval, and for coupling electric charge from said electrical network to said calibration means for the duration of a second time interval, said first and said second time intervals being equal.

* * * * *